United States Patent [19]

Su et al.

[11] Patent Number: 5,895,937
[45] Date of Patent: Apr. 20, 1999

[54] TAPERED DIELECTRIC ETCH IN SEMICONDUCTOR DEVICES

[75] Inventors: Yuh-Jia (Jim) Su, Cupertino; Yuen-Kui (Jerry) Wong, Fremont; Kam S. Law, Union City; Haruhiro (Harry) Goto, Saratoga, all of Calif.

[73] Assignee: Applied Komatsu Technology, Inc., Tokyo, Japan

[21] Appl. No.: 08/955,446

[22] Filed: Oct. 21, 1997

Related U.S. Application Data

[62] Division of application No. 08/541,066, Oct. 11, 1995, Pat. No. 5,728,608.

[51] Int. Cl.$^6$ .............. H01L 27/01; H01L 27/12; H01L 31/0392
[52] U.S. Cl. .............. 257/59; 257/347; 257/774; 438/149; 438/701; 438/713; 438/978
[58] Field of Search .............. 257/774, 59, 347; 438/713, 701, 978, 149

[56] References Cited

U.S. PATENT DOCUMENTS

| | | | |
|---|---|---|---|
| 4,054,895 | 10/1977 | Ham | 437/41 TFT |
| 4,447,290 | 5/1984 | Matthews | 156/646.1 |
| 4,807,016 | 2/1989 | Douglas | 357/67 |
| 4,893,167 | 1/1990 | Boudou et al. | 357/51 |
| 5,034,339 | 7/1991 | Tanaka et al. | 437/40 TFI |
| 5,094,900 | 3/1992 | Langley | 428/131 |
| 5,629,237 | 5/1997 | Wang et al. | 438/701 |
| 5,728,608 | 3/1998 | Su et al. | 438/149 |

FOREIGN PATENT DOCUMENTS

| | | | |
|---|---|---|---|
| 3714144 | 12/1987 | Germany | 156/646.1 |
| 62-293619 | 12/1987 | Japan . | |
| 4-261017 | 9/1992 | Japan . | |
| 5-226654 | 9/1993 | Japan . | |
| 6-196451 | 7/1994 | Japan . | |
| 61-248528 | 11/1996 | Japan . | |

OTHER PUBLICATIONS

Fujii, K., et al. Jpn. J. Appl. Phys. 31(I/12B) (Dec. 1992) 4574 "Process . . . LCDs addressed by a–Si TFTs".

Tokashiki, K., et al., Jpn. J. Appl. Phys 30(I/11B) (Nov. 1991) 3174 "Influence of halogen plasma atm. on SiO2 etching".

Pelletier, J., et al., J. Vac. Sci. Technol. B7(1) (Jan. 1989) 59 "Microwave plasma etching of Si and SiO2 in halogen . . . ".

*Primary Examiner*—William Mintel
*Attorney, Agent, or Firm*—Fish & Richardson P.C.

[57] ABSTRACT

A method of etching openings in a dielectric layer of a semiconductor device by utilizing a novel etchant gas system of sulfur hexafluoride/chlorine such that sloped sidewalls can be formed in the openings having a desired taper of between about 20° and about 85° for achieving improved step coverage and profile control of the TFT fabrication process.

17 Claims, 2 Drawing Sheets

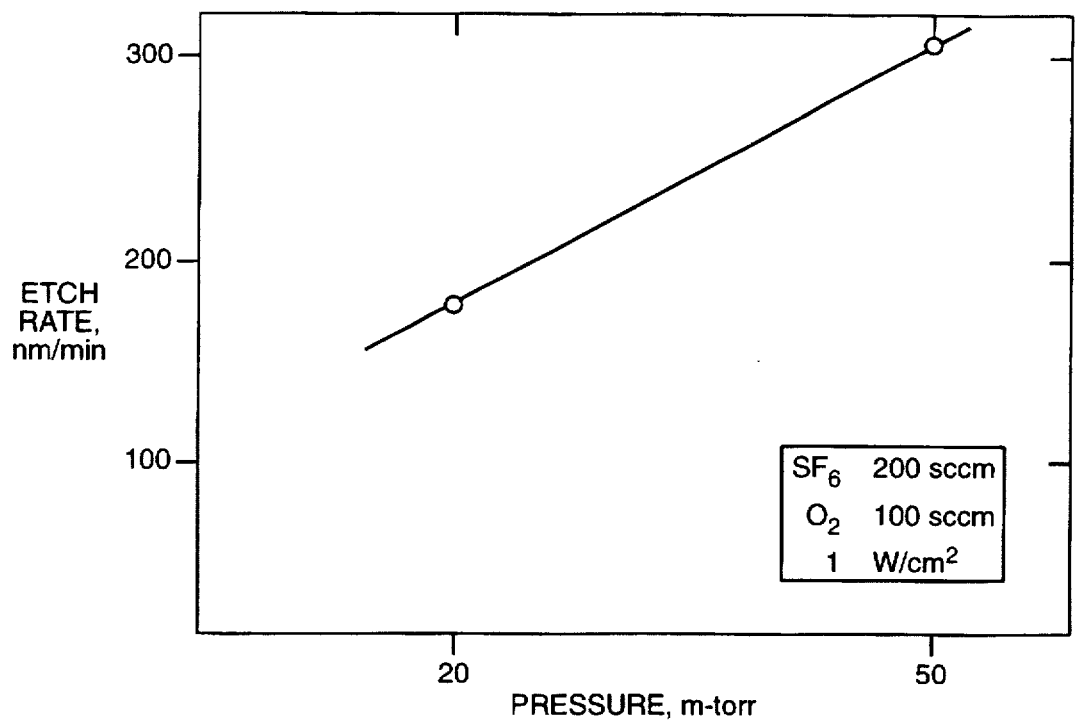
FIG._1A
*(PRIOR ART)*
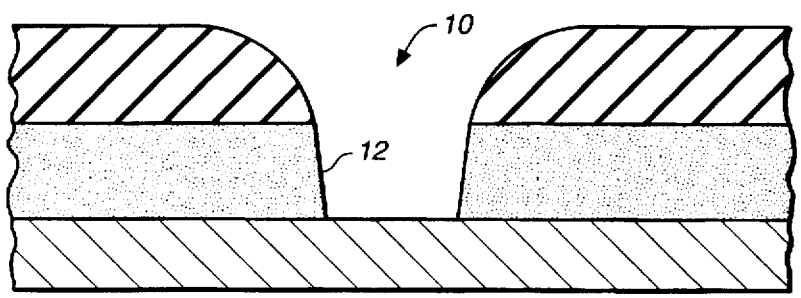
FIG._1B
*(PRIOR ART)*
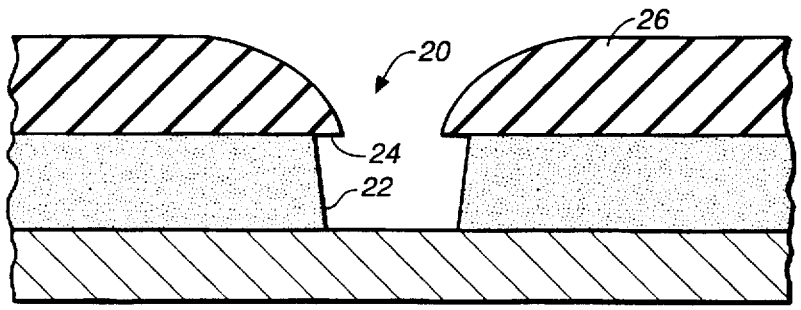
FIG._1C
*(PRIOR ART)*

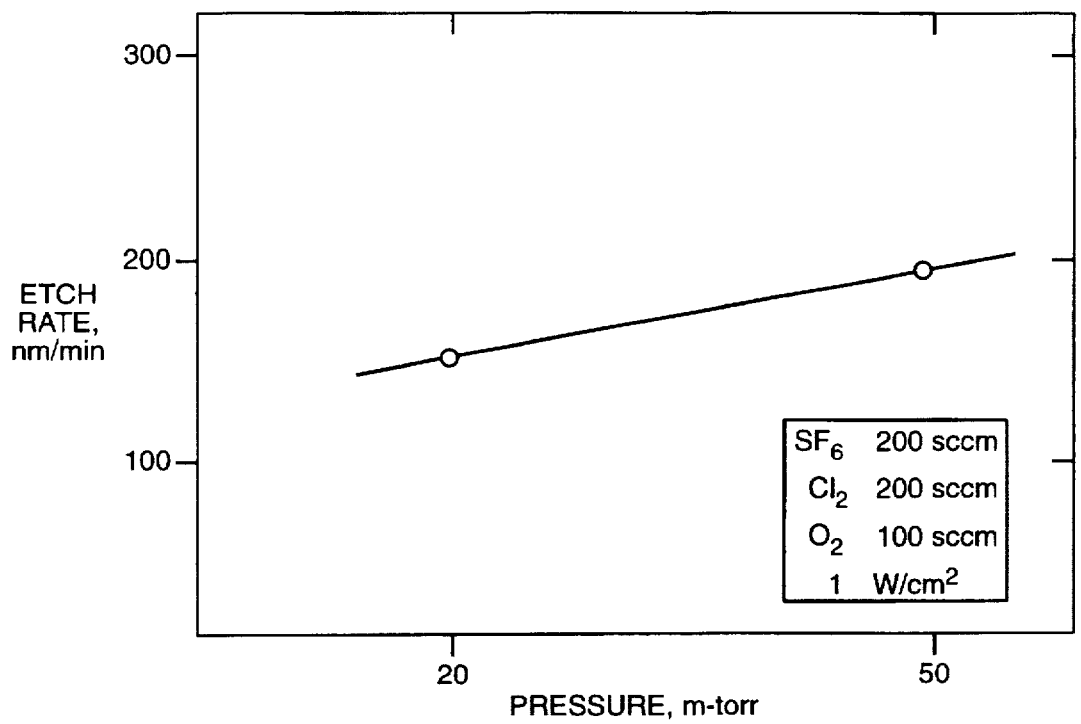
FIG._2A
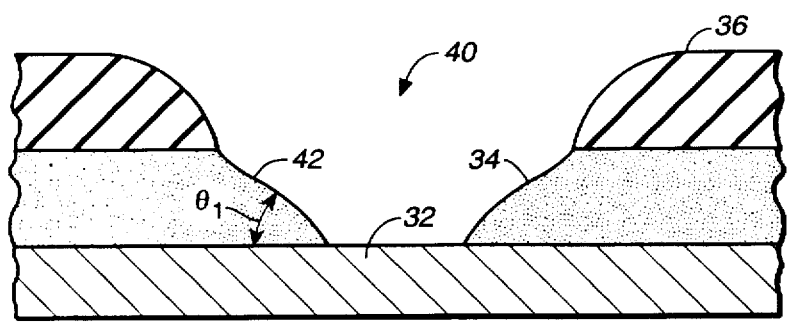
FIG._2B
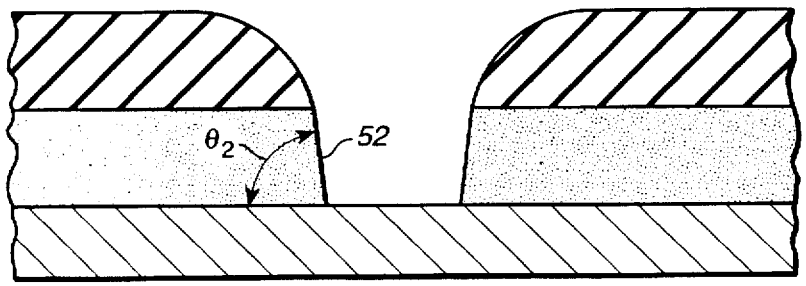
FIG._2C

TAPERED DIELECTRIC ETCH IN SEMICONDUCTOR DEVICES

This is a divisional of application Ser. No. 08,541,066, filed Oct. 11, 1995, now U.S. Pat. No. 5,728,608.

FIELD OF THE INVENTION

The present invention generally relates to a method of etching a dielectric layer in a semiconductor device. More particularly, the invention relates to a method of etching a dielectric layer in a semiconductor device by utilizing sulfur hexafluoride/chlorine chemistry. Tapered sidewalls in the opening of the dielectric layer are formed improving step coverage in subsequent deposition process.

BACKGROUND OF THE INVENTION

Recently, a thin film transistor (TFT) formed on the surface of an insulating substrate, such as glass or the like, has been widely used as a switching device in a matrix configuration to control a liquid crystal display device. The liquid crystal display device is used widely in televisions and computer monitors. In a liquid crystal display device, two glass plates are joined with a layer of a liquid crystal material sandwiched thereinbetween. The glass plates have conductive films coated on their surfaces where at least one of the substrates is transparent. The substrates are connected to a power source to change the orientation of the liquid crystal material so that various areas of the liquid crystal display cell can be accessed by proper patterning of the conductive film. The thin film transistors are used to separately address areas of the liquid crystal cells at very fast rates. As the requirements for the resolution of liquid crystal monitors increase, it becomes desirable to separately address a plurality of areas of the liquid crystal cell, called pixels. In a modern display panel, more than 1,000,000 pixels are normally present. The same number of thin film transistors must be formed on the glass plates so that each pixel can be separately addressed and latched into one of two stable states.

One of the major types of thin film transistor devices used today is a back channel etched (BCE) thin film transistor. A BCE type thin film transistor is fabricated by first forming a gate conductor on an upper surface of an insulating substrate, a gate dielectric layer of silicon nitride or silicon oxide is then deposited over the gate conductor. A substantially hydrogenated intrinsic amorphous silicon is then deposited over a hydrogen plasma treated silicon nitride layer. A layer of N+ doped amorphous silicon is subsequently deposited over the amorphous silicon layer. Thereafter, a layer of source/drain metalization is deposited over the N+ doped silicon layer and subsequently patterned to form respective source and drain electrodes. Plasma enhanced chemical vapor deposition (PECVD) process is commonly used for depositing materials in the fabrication of TFTs.

In a fabrication process for TFTs, numerous dielectric material layers are deposited. The dielectric materials employed include silicon nitride, silicon oxide, and any other suitable dielectric materials. The dielectric materials are used to insulate in, for example, a gate dielectric layer or a passivation layer. When electrical contacts must be made through a dielectric layer, the layer is etched by first applying a photomask to the layer to pattern openings for the contacts. The contact openings are then etched by a suitable etchant gas and filled in a subsequent metal deposition process. In a conventional-TFT fabrication process, a step coverage problem is frequently encountered in the etching and the subsequent metal deposition processes.

For example, a silicon nitride layer are conventionally etched using $SF_6/O_2$ chemistry as shown in FIGS. 1A through 1C. The etch rate of a silicon nitride film using $SF_6/O_2$ gas at 20 m-torr and 50 m-torr are shown in FIG. 1A. It is seen that at a chamber pressure of 20 m-torr, an etch rate of approximately 200 nm/min is obtained. At a higher chamber pressure of 50 m-torr, an etch rate of approximately 300 nm/min is obtained. An enlarged cross-sectional view of a semiconductor device 10 etched at 20 m-torr is shown in FIG. 1B. A vertical sidewall in the silicon nitride opening is obtained by the $SF_6/O_2$ gas etching. An enlarged cross-sectional view of an attached semiconductor device 20 using the same etchant gas at 50 m-torr is shown in FIG. 1C. A vertical sidewall 22 in the silicon nitride layer is obtained showing a small undercut 24.

The etching of silicon nitride using $SF_6/O_2$ presents a profile control problem which leads to poor step coverage in the subsequent metal deposition process. The step coverage problem occurs when sharp corners in the opening created by the vertical sidewalls are not covered by the subsequently deposited metal. As a result, voids at the corners are formed. The voids increase the resistance of the metal conductor and decrease the efficiency of the device. Therefore, the formation of vertical sidewalls in nitride openings should be avoided.

It is therefore an object of the present invention to provide a method of etching a dielectric layer in a semiconductor device that overcomes the drawbacks and shortcomings associated with the prior art.

It is another object of the present invention to provide a method for etching a dielectric layer in a semiconductor device that improves profile control.

It is a further object of the present invention to provide a method of etching holes or trenches in a dielectric layer of a semiconductor device and then filling the holes or trenches without step coverage.

It is yet another object of the present invention to provide a method of etching openings of holes or trenches in a dielectric layer of a semiconductor device without forming vertical sidewalls in the etched openings.

It is still another object of the present invention to provide a method of etching openings in a dielectric layer of a semiconductor device using an etchant gas mixture of $SF_6/Cl_2$.

It is further object of the present invention to provide a method of etching openings in a dielectric layer of a semiconductor device producing sloped sidewalls in the openings.

It is a further object of the present invention to provide a method of etching openings in a dielectric layer of a semiconductor device producing sloped sidewalls having a taper between about 20° and about 85° in the openings.

It is a further object of the present invention to provide a method of etching openings in a dielectric layer of a semiconductor device producing sloped sidewalls in the openings such that void formations in a subsequent deposition process are avoided.

SUMMARY OF THE INVENTION

One aspect of the present invention is a method of etching openings in a dielectric layer in a semiconductor device that is capable of producing sloped sidewalls in the openings of the dielectric layer.

In a preferred embodiment, the invention includes a method of etching a silicon nitride dielectric layer using an etchant gas system including sulfur hexafluoride/chlorine. The chlorine gas etches away the edge portion of the photoresist layer deposited on the silicon nitride to exposing a larger area of the nitride. Sulfur hexafluoride attacks the nitride to form sloped sidewalls. The taper of the sloped sidewalls can be controlled to within a range of between about 20° and about 85° by changing the ratio of the gas mixture. A preferred range of the taper is between about 35° and about 70°. Optionally, oxygen may be used as a third component in the gas mixture to further facilitate the etching process. It is believed that oxygen accelerates the etching processes of both the photoresist layer and the silicon nitride layer. The sloped sidewalls facilitate subsequently depositing a metal contact layer.

The present etching method affords improved profile control during a semiconductor fabrication process. The etching method also substantially eliminates step coverage. Void formation in a contact opening after metal deposition can be avoided improving the overall performance of the device.

The present invention is further includes a semiconductor device fabricated from a substrate having a dielectric layer deposited thereon and having openings with sloped sidewalls etched in the dielectric layer. The device has improved quality and performance since metal contacts formed in the openings are free of step coverage.

BRIEF DESCRIPTION OF THE DRAWINGS

Other objects, features and advantages of the present invention will become apparent upon consideration of the specification and the appended drawings.

FIG. 1A is a graph illustrating the etch rate dependence of the silicon nitride etching process on the $SF_6/O_2$ gas pressure.

FIG. 1B is an enlarged cross-sectional view of a semiconductor substrate etched at 20 m-torr chamber pressure by $SF_6/O_2$.

FIG. 1C is an enlarged cross-sectional view of a semiconductor substrate etched by $SF_6/O_2$ at a chamber pressure of 50 m-torr.

FIG. 2A is a graph illustrating the etch rate dependence of silicon nitride on the $SF_6/Cl_2/O_2$ gas pressure.

FIG. 2B is an enlarged cross-sectional view of a semiconductor substrate etched by $SF_6/Cl_2/O_2$ at a chamber pressure of 20 m-torr.

FIG. 2C is an enlarged cross-sectional view of a semiconductor substrate etched by $SF_6/Cl_2/O_2$ at a chamber pressure of 50 m-torr.

DETAILED DESCRIPTION OF THE PREFERRED EMBODIMENT

The present method of etching openings in a dielectric layer of a semiconductor device utilizes a unique etchant gas mixture of sulfur hexafluoride/chlorine. For improving step coverage and profile control.

In an inverted, trilayer TFT structure, a thin film dielectric material such as silicon nitride or silicon oxide is used for the gate dielectric layer and the channel passivation layer. A plasma enhanced chemical vapor deposition technique is used to deposit the silicon nitride or the silicon oxide layer. In the present invention, the silicon nitride film is etched. However, the (method) of etching sloped openings in a dielectric layer can be equally applied to silicon oxide or any other suitable dielectric materials.

FIG. 2A. illustrates the etch rate dependence of silicon nitride on the chamber pressure using gas mixture of $SF_6/Cl_2/O_2$ is illustrated. A laboratory test sample is prepared by providing a substrate made of a glass material such as Corning 7059 containing 49% $SiO_2$, 10% $Al_2O_3$, 15% $B_2O_3$, 25% BaO and 1% $As_2O_5$. In an etchant gas mixture of $SF_6/Cl_2/O_2$, the etch rate using the same gas mixture on the glass at 20 m-torr chamber pressure is approximately 100 nm/min. It is not significantly lower than the etch rate on silicon nitride. i.e. approximately 150 nm/min at 20 m-torr. The glass substrate is therefore not an effective etch stop for the nitride layer. However, the etching of nitride can be effectively controlled by an optical emission end point technique wherein the ion emission at the etch surface is monitored. The etching process can be stopped when the nitride layer is completely etched away.

As shown in FIG. 2B, a silicon nitride layer 34 of approximately 200 nm thick is deposited on a glass substrate 32. A suitable thickness is in the range of between about 100 nm and about 300 nm. A photoresist 36 of approximately 1200 nm thick is deposited and patterned on the nitride layer 34. An opening 40 being a hole or a trench is etched into the nitride layer 34.

The etching of the nitride layer is conducted using a reactive ion etching process performed at a predetermined radio frequency and utilizing the special etchant gas system. In the example shown in FIG. 2B, the etchant gas is fed into the reaction chamber at a flow rates 200 sccm of $SF_6$, 200 sccm $Cl_2$ and 100 sccm $O_2$. A minimum chamber pressure containing 5 m-torr of the etchant gas should be used. Chamber pressure as high as 100 m-torr can be used.

As shown in FIG. 2B, at 20 m-torr chamber pressure, an opening 40 having sloped sidewalls 42 with a taper $\theta_1$ of approximately 45° is obtained. The taper of the sidewall is measured from the top surface of the glass substrate 32. In a TFT fabrication process, due to the large surface area of the substrate, a minimum flow rate of the etchant gas must be maintained in order to achieve an acceptable etch rate. For instance, for a typical TFT substrate of 36 cm×46.5 cm, a flow rate of 200 sccm $SF_6$, 200 sccm $Cl_2$, and 100 sccm $O_2$ is required. A carrier gas of argon or helium, either alone or in mixtures thereof, may optionally be added to the etchant gas system.

In the example given above, the flow rate ratio of $Cl_2$ and $SF_6$ in the etchant gas is 1. It has been discovered that the flow rate ratio of $Cl_2/SF_6$ can be any value between about 0.5 and about 1.5. The presence of oxygen is optional. Oxygen provides the additional benefit of increasing the etch rate of $SF_6$ and $Cl_2$. The power density used for the plasma source is about 1 $W/cm^2$. The range of the power density is between about 0.4 $W/cm^2$ and about 2 $W/cm^2$. The presence of oxygen is generally believed not contributing to the profile of the sidewall formed.

It is believed that in the etchant gas system, $SF_6$ is responsible for removing nitride while $Cl_2$ is responsible for removing photoresist. Oxygen enhances both the photoresist and the nitride removal.

Shown in the example of FIGS. 2A–2C, is silicon nitride deposited on a glass substrate. In a fabrication process for TFT, silicon nitride or any other dielectric material can be deposited over other semiconducting or conducting material layers. For instance, silicon nitride is commonly used in TFT fabrication as a gate dielectric layer or as a channel passivation layer.

Shown in FIG. 2C is the enlarged cross-sectional view of a silicon nitride layer etched at a higher chamber pressure, i.e. 50 m-torr. A desirable, sloped sidewall 52 is formed in the process. The slope achieved is greater than that achieved at a chamber pressure of 20 m-torr, i.e. a taper $\theta_2$ of approximately 60°. It has been discovered that by adjusting the flow rate ratio of $Cl_2/SF_6$, the taper of the sloped sidewalls in the nitride layer can be suitably adjusted. To achieve maximum step coverage and improved profile control in a fabrication process, a taper of the sidewall between about 20° and about 85° is desirable. A more preferred range of the taper is between about 35° and about 70°. It should be noted that any taper of the sidewall should contribute to a reduction of void formation in the openings, even though the maximum effect is achieved in the above stated ranges of taper.

After etched openings for holes or trenches are formed in the nitride layer, a conductive material is deposited into the openings. A commonly used conductive material in TFT fabrication is indium-tin-oxide (ITO). However, other conductive metals such as aluminum, tantalum, molybdenum or any other suitable metals can be used to form contacts.

While the present invention has been described in an illustrative manner, it should be understood that the terminology used is intended to be in a nature of words of description rather than of limitation.

Furthermore, while the present invention has been described in terms of a preferred embodiment thereof, it is to be appreciated that those skilled in the art will readily apply these teachings to other possible variations of the invention.

The embodiments of the invention in which an exclusive property or privilege is claimed are defined as follows:

1. A thin film transistor made by:
   providing a substrate including a dielectric layer in contact with a pattern photoresist layer;
   etching the exposed dielectric layer with a gas comprising $SF_6$ and $Cl_2$ to form at least one etched opening; and,
   depositing a conductive material into at least a portion of the opening.

2. The thin film transistor of claim 1, wherein said substrate includes substantially $SiO_2$ and BaO.

3. The thin film transistor of claim 1, wherein said substrate is made of glass.

4. The thin film transistor of claim 1, wherein said dielectric layer includes silicon nitride or silicon oxide.

5. The thin film transistor of claim 1, wherein said conductive material includes a material selected from the group consisting of indium-tin-oxide, aluminum, tantalum and molybdenum.

6. The thin film transistor of claim 1, wherein said at least one etched opening has sidewalls sloped at a taper of between about 20° and about 85° as measured from a top surface of the substrate.

7. The thin film transistor of claim 1, wherein said at least one etched opening has sidewalls sloped at a taper of between about 35° and about 70° as measured from a top surface of the substrate.

8. A thin film transistor made by:
   providing a substrate including a dielectric layer in contact with a pattern photoresist layer;
   etching the exposed dielectric layer and the pattern photoresist layer with a gas comprising $Cl_2$ and $SF_6$ in a ratio of about 0.5–1.5 and at a pressure of about 5–100 mTorr to form at least one etched opening, and
   depositing a conductive material in at least a portion of the at least one etched opening.

9. The thin film transistor of claim 8, wherein the pressure is about 20–50 mTorr, and wherein the at least one etched opening has sloped sidewalls substantially free of an undercut in the dielectric layer.

10. The thin film transistor of claim 8, wherein the ratio of $Cl_2$ and $SF_6$ is about 1.

11. The thin film transistor of claim 9, wherein said sloped sidewalls have a taper of at least 20° as measured from a top surface of said substrate.

12. A thin film transistor made by:
   providing a substrate including an insulative material,
   depositing about 100–300 nanometers of a dielectric layer comprising silicon nitride on the substrate,
   depositing and patterning a photoresist layer on said dielectric material,
   etching the dielectric and photoresist layers with a mixture of $SF_6$ gas and $Cl_2$ gas in a ratio of $Cl_2$ to $SF_6$ in the range of about 0.5 to 1.5; and,
   producing at least one opening having substantially sloped sidewalls
   wherein the sloped sidewalls are substantially free of undercutting.

13. The thin film transistor of claim 12, wherein the $SF_6$ has a flowrate of about 200 sccm and the $Cl_2$ has a flowrate of about 200 sccm.

14. The thin film transistor of claim 13, wherein the gas mixture further includes $O_2$ at a flowrate of about 100 sccm.

15. The thin film transistor of claim 14, wherein the gas mixture further includes a carrier effective flowrate of a member selected from the group consisting of argon, helium and mixtures thereof.

16. The thin film transistor of claim 12, wherein the photoresist layer has a thickness of about 1200 nanometer.

17. The thin film transistor of claim 12, wherein the etching occurs at power density of about 0.4–2 watts/centimeter$^2$.

* * * * *